(12) United States Patent
Shin et al.

(10) Patent No.: US 11,849,607 B2
(45) Date of Patent: Dec. 19, 2023

(54) DISPLAY APPARATUS INCLUDING A QUANTUM DOT LAYER

(71) Applicant: Samsung Display Co., Ltd., Yongin-si (KR)

(72) Inventors: Beomsoo Shin, Yongin-si (KR); Sukhoon Kang, Yongin-si (KR); Jaejin Lyu, Yongin-si (KR); Hyungguen Yoon, Yongin-si (KR); Sunghwan Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 303 days.

(21) Appl. No.: 17/165,789

(22) Filed: Feb. 2, 2021

(65) Prior Publication Data
US 2021/0391395 A1 Dec. 16, 2021

(30) Foreign Application Priority Data
Jun. 15, 2020 (KR) ........................ 10-2020-0072605

(51) Int. Cl.
*H10K 59/122* (2023.01)
*H10K 50/115* (2023.01)
*H10K 50/854* (2023.01)
*H10K 59/38* (2023.01)

(52) U.S. Cl.
CPC ......... *H10K 59/122* (2023.02); *H10K 50/115* (2023.02); *H10K 50/854* (2023.02); *H10K 59/38* (2023.02)

(58) Field of Classification Search
None
See application file for complete search history.

(56) References Cited

U.S. PATENT DOCUMENTS

| 5,814,434 A * | 9/1998 | Nakamura ........ G02F 1/133512 430/25 |
| 9,653,685 B2 | 5/2017 | Watanabe |
| 2008/0314273 A1* | 12/2008 | Tamanuki .............. B41M 3/003 101/465 |
| 2009/0231521 A1* | 9/2009 | Kashiwagi ........ G02F 1/133516 430/7 |
| 2017/0123317 A1* | 5/2017 | Kamura ................. G02B 5/201 |
| 2018/0088465 A1* | 3/2018 | Kwon ................. C08G 73/105 |
| 2018/0292750 A1* | 10/2018 | Lee ......................... H01L 27/32 |

(Continued)

FOREIGN PATENT DOCUMENTS

| KR | 10-2015-0110366 A | 10/2015 |
| KR | 10-2016-0015815 A | 2/2016 |

(Continued)

*Primary Examiner* — Nduka E Ojeh
(74) *Attorney, Agent, or Firm* — Lewis Roca Rothgerber Christie LLP

(57) ABSTRACT

A display apparatus includes: a first substrate on which a plurality of light-emitting devices are arranged; a plurality of light controllers arranged above the first substrate and corresponding to the plurality of light-emitting devices; and a plurality of banks between the plurality of light controllers, wherein each bank of the plurality of banks includes a black pigment and a scattering agent. Because the display apparatus according to an embodiment includes a bank including a black pigment and a scattering agent, color mixing between pixels is prevented or reduced, and light efficiency is increased.

18 Claims, 9 Drawing Sheets

(56) References Cited

U.S. PATENT DOCUMENTS

| | | | |
|---|---|---|---|
| 2020/0033670 A1 | 1/2020 | Lee et al. | |
| 2021/0193968 A1* | 6/2021 | Lee | H01L 51/5284 |
| 2021/0356636 A1* | 11/2021 | Yu | H10K 50/854 |
| 2022/0317511 A1* | 10/2022 | Shi | G02F 1/133512 |

FOREIGN PATENT DOCUMENTS

| | | |
|---|---|---|
| KR | 10-2018-0002364 A | 1/2018 |
| KR | 10-2018-0025466 A | 3/2018 |
| KR | 10-2019-0016631 A | 2/2019 |

* cited by examiner

DISPLAY APPARATUS INCLUDING A QUANTUM DOT LAYER

CROSS-REFERENCE TO RELATED APPLICATION

This application claims priority to and the benefit of Korean Patent Application No. 10-2020-0072605, filed on Jun. 15, 2020, in the Korean Intellectual Property Office, the entire content of which is incorporated herein by reference.

BACKGROUND

1. Field

One or more aspects of embodiments of the present disclosure relate to a display apparatus, and more particularly, to a display apparatus using a quantum dot layer.

2. Description of Related Art

For example, a display apparatus such as an organic light-emitting display apparatus that displays or realizes an image by generating light, based on a principle that holes and electrons (which are provided from an anode and a cathode) recombine in an emission layer to emit light. For example, the display apparatus includes pixels emitting light in one selected from a red color, a green color, and a blue color to display a preferred (or set) color based on a color combination thereof.

To this end, each of the pixels includes: a light-emitting device to generate single-colored light such as white light or blue light; and a quantum dot layer and a color filter as light controllers to convert the single-colored light into a preferred (or desired) color of light from among red light, green light, and blue light, and then outputting the preferred (or desired) color of light. In other words, when the light-emitting device of each pixel generates single-colored light, the single-colored light is converted into light from among red light, green light, and blue light by passing through the quantum dot layer and the color filter, and then the light is output, and a preferred (or desired) color of an image may be displayed or realized based on a color combination of the pixels of which light is output.

SUMMARY

One or more aspects of embodiments of the present disclosure are directed toward a display apparatus including a bank that may prevent (or reduce) color mixing between pixels and increase light efficiency.

Additional aspects will be set forth in part in the description which follows and, in part, will be apparent from the description, or may be learned by practice of the presented embodiments of the disclosure.

According to one or more embodiments, a display apparatus includes
a first substrate on which a plurality of light-emitting devices are arranged,
a plurality of light controllers arranged above the first substrate and corresponding to the plurality of light-emitting devices, and
a plurality of banks between the plurality of light controllers,
wherein each of the plurality of banks includes a black pigment and a scattering agent.

The display apparatus further includes a second substrate facing the first substrate, and the plurality of light controllers and the plurality of banks may be between the first substrate and the second substrate.

Each bank may have an upper portion facing in a direction toward the first substrate, or an upper portion facing in a direction toward the second substrate, and the upper portion facing in the direction toward the first substrate, or the upper facing in the direction toward the second substrate, may be hydrophobic.

In the upper portion of each bank facing in the direction toward the first substrate, or the upper portion of each bank facing in the direction toward the second substrate, cross-linked fluorine-containing polymer may be lopsidedly arranged.

The fluorine-containing polymer may include polytetrafluoroethylene (PTFE), perfluoropolyether (PFPE), or any combination thereof.

A surface energy of the upper portion of each bank facing in the direction toward the first substrate, or a surface energy of the upper portion of each bank facing in the direction toward the second substrate, may be about 25 dyne/cm or less.

The black pigment and the scattering agent may each be dispersed in each bank.

An amount of the scattering agent may be about 10 times or more an amount of the black pigment.

An amount of the black pigment in each bank may be about 0.25 wt % to about 1.0 wt % based on a total weight of the bank.

An amount of the scattering agent in each bank may be about 10 wt % or more based on a total weight of the bank.

The black pigment may include carbon black, graphite, an iron oxide, or any combination thereof.

The scattering agent may include a metal oxide, a non-metal oxide, or any combination thereof.

The scattering agent may include $SiO_2$, $BaSO_4$, $Al_2O_3$, ZnO, $ZrO_2$, $TiO_2$, or any combination thereof.

These and/or other aspects will become apparent and more readily appreciated from the following description of the embodiments, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
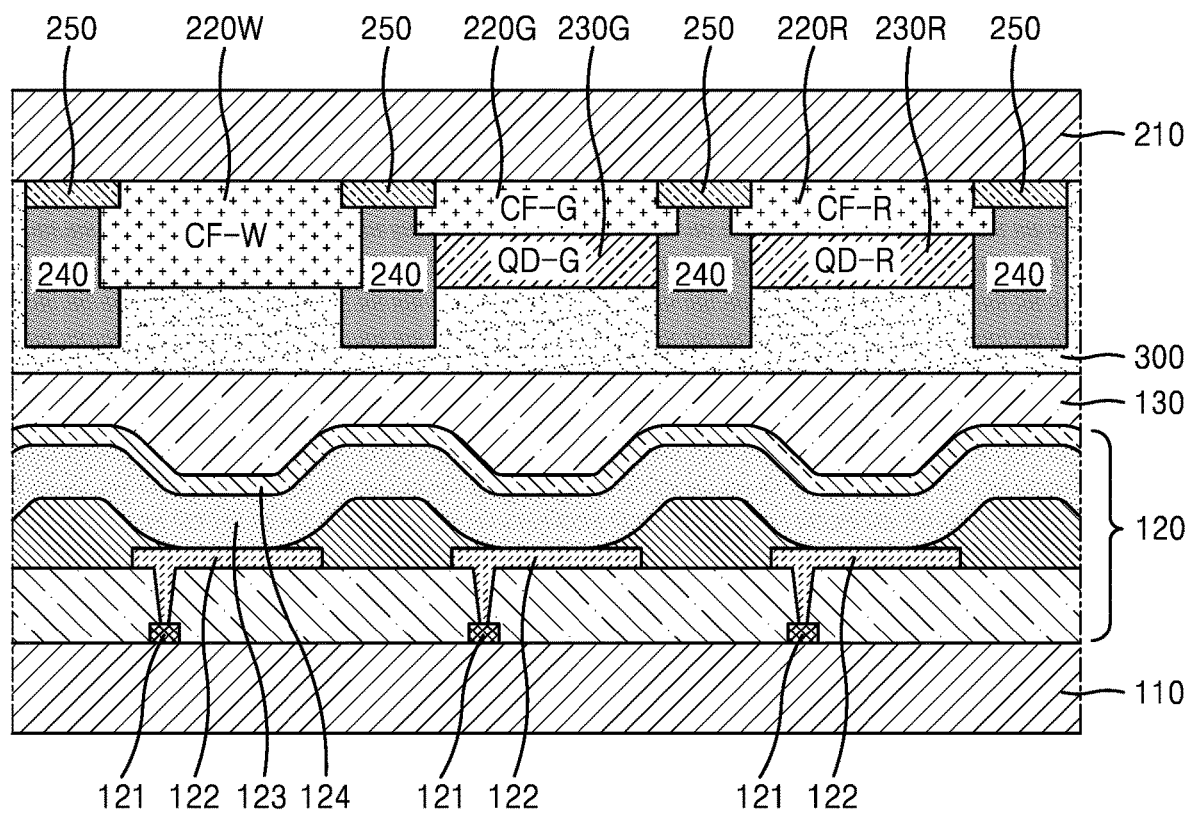
FIG. 1 is a cross-sectional view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Further, expressions such as "at least one selected from," "one of," and "selected from," when preceding a list of elements, modify the entire list of elements and do not modify the individual elements of the list. Further, the use of "may" when describing embodiments of the present disclosure refers to "one or more embodiments of the present disclosure."

Because the disclosure may have diverse modified embodiments, preferred embodiments are illustrated in the drawings and are described in more detail in the detailed description. An effect and a characteristic of the disclosure, and a method of accomplishing these should be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are not provided.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to (or different from) the described order.

It will be understood that when a layer, region, or component is referred to as being connected to another layer, region, or component, it can be directly connected to the other layer, region, or component (with no intervening layers, regions, or components therebetween), or indirectly connected to the other layer, region, or component (that is, for example, intervening layers, regions, or components may be present). For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as intervening layer, region, or component may be present.

FIG. 1 is a cross-sectional view of a display apparatus according to an embodiment. Here, although only one set of a three-color pixel, that is, a red pixel, a green pixel, and a blue pixel, is illustrated, an actual product may have a plurality of sets of such three-color pixel distributed therein.

As illustrated in FIG. 1, the display apparatus of the embodiment may have a structure in which a first substrate 110 and a second substrate 210 are bonded to each other with a filling material 300 therebetween, the first substrate 110 on which a light-emitting device 120 is arranged and the second substrate 210 on which light controllers, namely, a quantum dot layer 230R, a quantum dot layer 230G, a color filter layer 220R, a color filter layer 220G, and a color filter layer 220W (also referred to as a white color filter layer 220W) are arranged.

According to another embodiment, the light controllers, namely, the quantum dot layers 230R and 230G and the color filter layers 220R, 220G, and 220W, may be directly stacked on the light-emitting device 120. For example, after the light controllers are directly stacked on the light-emitting device 120 arranged on a first substrate, a display apparatus may be manufactured by bonding the first substrate and a second substrate. In this case, a bank exists between the light controllers.

According to another embodiment, after the light controllers, namely, the quantum dot layers 230R and 230G and the color filter layers 220R, 220G, and 220W, are directly stacked on the light-emitting device 120 arranged on a first substrate, a display apparatus may be manufactured without a second substrate.

In some embodiments, the light-emitting device 120 has a structure in which an interlayer 123 including an emission layer is positioned between a first electrode 122 and a second electrode 124, and may generate light, based on a principle that holes and electrons, which are provided from the first electrode 122 and the second electrode 124, recombine in an emission layer within an interlayer to emit light. Each of the red pixel, the green pixel, and the blue pixel may generate the same blue light. For example, the light-emitting device 120 may generate the same blue light, and the light controllers of each pixel may convert the blue light into red light, green light, or blue light. More details of the light-emitting device 120 will be described hereinbelow.

A reference numeral 121 represents a pixel circuit connected to the first electrode 122, and includes elements such as a thin-film transistor and a capacitor. In addition, a reference numeral 130 represents a thin-film encapsulation layer that protects the light-emitting device 120 by covering the light-emitting device 120, and may be a single-layered film of an organic film or an inorganic film, or may be a multi-layered film in which an organic film and an inorganic film are alternately stacked. The inorganic film may include, for example, silicon oxide, silicon nitride, and/or silicon oxynitride, and the organic film may include polyethylene terephthalate, polyethylene naphthalate, polycarbonate, polyimide, polyethylene sulfonate, polyoxymethylene, polyarylate, hexamethyldisiloxane, acryl-based resin (for example, polymethylmethacrylate and/or polyacrylic acid), or any combination thereof.

The light controllers may include a quantum dot layer, a color filter layer, or any combination thereof.

The light controllers include the quantum dot layers 230R and 230G and the color filter layers 220R, 220G, and 220W, wherein the quantum dot layers 230R and 230G are to convert blue light generated by the light-emitting device 120 into a wanted (desired) color from among red and green, and the color filter layers 220R, 220G, and 220W increase color purity by filtering mixed light that may be partially mixed in the converted color light. Here, the red pixel includes both the quantum dot layer 230R and the color filter layer 220R, and the green pixel includes both the quantum dot layer 230G and the color filter layer 220G, whereas the blue pixel includes only the white color filter layer 220W because light generated by the light-emitting device 120 is blue light. In other words, because a color of light generated by the light-emitting device 120 does not need to be changed in the blue pixel, and the light only has to intactly pass through the blue pixel, the blue pixel includes only the white color filter layer 220W to filter out mixed light (e.g., light mixed in from the red pixel and/or green pixel).

A reference numeral 250 may represent a black matrix between each pixel to block light, and a reference numeral 240 may represent a bank that defines a boundary between every position between light controllers of each pixel.

For example, the reference numeral 250 may be formed as a blue color filter.

For example, a bank 240 and a black matrix 250 may be formed as an integrated bank and black matrix (e.g., a bank 240 and a black matrix 250 may be formed integrally with each other). In this case, the integrated bank and black matrix may include a black pigment and a scattering agent.

The bank 240 has characteristics in which a one-side surface facing the first substrate 110 is hydrophobic. This is a measure designed to prevent (or reduce) the one-side surface of the bank 240 from being contaminated by droplets sprayed from an ink jet when the quantum dot layers 230R and 230G are formed by using an ink-jet method during a manufacturing process, and to this end, the bank 240 has a structure in which a fluorine-containing polymer is lopsidedly arranged at the one-side surface thereof. For example, the fluorine-containing polymer may include polytetrafluoroethylene (PTFE), perfluoropolyether (PFPE), or any combination thereof. A surface energy of an upper portion of each bank facing in a direction toward a first substrate may be about 25 dyne/cm or less. The upper portion of the bank indicates an upper portion facing in a direction opposite to a direction of gravity during a manufacturing process. Here, when the banks are stacked on the second electrode 210 during the manufacturing process, the upper portion of each bank faces the first substrate 110. For example, the surface energy of the upper portion of each bank in the direction toward the first substrate may be about 20 dyne/cm or less. In a case where the surface energy is greater than about 25 dyne/cm, when a quantum dot layer is formed by an ink-jet printer, hydrophobicity is insufficient, such that the one-side surface of the bank 240 may be stained with the droplets.

For example, when a display apparatus is formed using only a first substrate (e.g., formed without a second substrate), an upper portion of a bank may be hydrophobic, wherein the upper portion of the bank indicates an upper portion facing in a direction opposite to a direction of gravity during a manufacturing process (e.g., the upper portion of a bank may face oppositely away from the first substrate). Prior to stacking the light controllers, namely, a quantum dot layer and/or a color filter layer, above the first substrate on which a plurality of light-emitting devices are arranged, banks are formed. The bank includes a black pigment and a scattering agent, and the black pigment and the scattering agent are each dispersed throughout the bank. When the quantum dot layer and/or the color filter layer are formed between the formed banks by using an ink jet, because the upper portion of the bank is hydrophobic, an ink-jet operation is facilitated.

Figure 3:
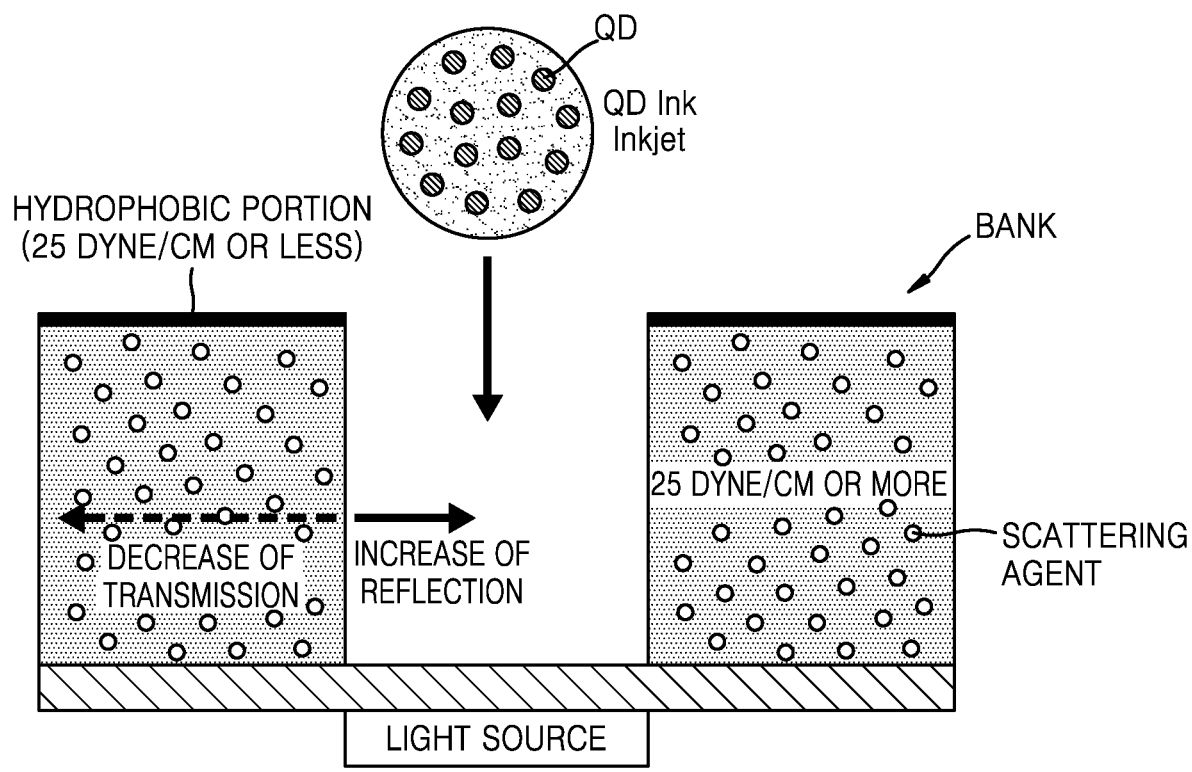
FIG. 3 is a schematic diagram of a bank of a display apparatus according to an embodiment.

FIG. 3 is a schematic diagram of a bank of a display apparatus according to an embodiment.

The bank includes a black pigment and a scattering agent, and the black pigment and the scattering agent are each dispersed throughout the bank.

Referring to FIG. 3, a QD composition is sprayed between banks by using an ink jet so as to form a quantum dot layer. As described above, in order to protect or prevent a one-side surface of the bank from being contaminated by the QD composition during spraying of the ink jet, an upper portion of the bank (including the one-side surface) has hydrophobicity during the spraying of the ink jet, and in this case, a surface energy may be about 25 dyne/cm. For example, the surface energy may be about 20 dyne/cm.

According to another embodiment, an upper portion of each of the banks facing in a direction toward a second substrate has hydrophobicity. This corresponds to a case in which the light controllers, namely, the quantum dot layers 230R and 230G and the color filter layers 220R, 220G, and 220W, are directly stacked on the light-emitting device 120. A bank exists between the light controllers, and when a QD composition is sprayed between banks by using an ink jet to form a quantum dot layer, an upper portion of a bank (in this case, referring to an upper portion of a bank in the direction toward the second substrate) has hydrophobicity during spraying of an ink jet in order to prevent (or protect) a one-side surface (included in the upper portion) of the bank from being contaminated by the QD composition due to the spraying of an ink jet. In this case, a surface energy may be about 25 dyne/cm. For example, the surface energy may be about 20 dyne/cm. Likewise, the bank includes a black pigment and a scattering agent, and the black pigment and the scattering agent are each dispersed throughout the bank.

A single-colored light generated from a light source (for example, an organic light-emitting device) is output by being converted into a color of light from among red light, green light, and blue light, while passing through a quantum dot layer and a color filter.

In some embodiments, light output in a red color, a green color, and/or a blue color may pass through a bank and be mixed with each other. In related art, in order to prevent (or reduce) color mixing, a black pigment is added to a bank, however in this case, although color mixing may be prevented or reduced, light efficiency is also reduced by 22% or more.

In order to increase light efficiency, there is a related art method in which a (semi)transparent bank including a scattering agent is applied, however in this case, although light efficiency may increase due to an increase in reflectance, blue light and quantum dot-converted light may pass through the bank, resulting in color mixing.

A display apparatus according to an embodiment introduces a bank including both a black pigment and a scattering agent, wherein, by adjusting an amount of the black pigment and/or an amount of the scattering agent, color mixing may be prevented or reduced, and efficiency may also be increased.

In some embodiments, a bank composition is applied on a substrate and cured, followed by a photolithography process. A more detailed process thereof will be described hereinbelow.

The bank composition includes, for example, a curable polymer, a photoresist compound, a fluorine-containing polymer, a black pigment, a scattering agent, and a solvent, and when the bank composition is cured, the solvent evaporates completely. Accordingly, a total weight of a curable polymer, a photoresist compound, a fluorine-containing polymer, a black pigment, and a scattering agent, which are solids in the bank composition (whereas the solvent is not a solid), is substantially the same as a weight of the bank after curing. In other words, a total weight of the bank after curing may be equal to a weight of the solids in the bank composition.

An amount of the scattering agent may be about 10 times or more an amount of the black pigment.

For example, the amount of the scattering agent may be about 10 times to about 80 times the amount of the black pigment.

The amount of the black pigment in each bank may be about 0.25 wt % to about 1.0 wt % based on a total weight of the bank.

As a result of numerous experiments, in a case where a transmittance and a reflectance were measured with blue light of 450 nm with respect to a bank having a width of 10 µm, inventors of the present disclosure discovered that when an amount of a black pigment is less than 0.25 wt % based on a total weight of the bank, the transmittance is greater than 10%, and thus color mixing occurs, and when an amount of a black pigment is greater than 1.0 wt % based on a total weight of the bank, the reflectance is reduced to below 15%, and thus an incremental value of light efficiency moves away from the max.

An amount of the scattering agent in each bank may be about 10 wt % or more based on a total weight of the bank.

As a result of numerous experiments, the inventors of the present disclosure discovered that an amount of a scattering agent should be 10 wt % or more based on a total weight of the bank in order to satisfy (achieve) a transmittance of 10% or less, and an amount of a scattering agent should be 5 wt % or more based on a total weight of the bank in order to satisfy (achieve) a reflectance of 15% or more. An amount of a scattering agent should be 10 wt % or more based on a total weight of the bank in order to satisfy (achieve) both the transmittance of 10% or less and the reflectance of 15% or more.

For example, an amount of the scattering agent is 10 wt % to 20 wt % based on a total weight of the bank.

For example, an amount of the black pigment may be 0.25 wt % based on a total weight of the bank, and an amount of the scattering agent may be 10 wt %, 11 wt %, 12 wt %, 13 wt %, 14 wt %, 15 wt %, 16 wt %, 17 wt %, 18 wt %, 19 wt %, or 20 wt % based on a total weight of the bank.

For example, an amount of the black pigment may be 1.0 wt % based on a total weight of the bank, and an amount of the scattering agent may be 10 wt %, 11 wt %, 12 wt %, 13 wt %, 14 wt %, 15 wt %, 16 wt %, 17 wt %, 18 wt %, 19 wt %, or 20 wt % based on a total weight of the bank.

The filling material 300 may be between the first substrate 110 and the second substrate 210, the filling material 300 functioning as both a gap maintainer for maintaining an appropriate distance between the two substrates 110 and 210, and a bonding agent. Accordingly, when the filling material 300 is applied between the two substrates 110 and 210, which are then bonded together, the filling material 300 firmly bonds the two substrates 110 and 210 together while properly (or suitably) maintaining a gap between the two substrates 110 and 210.

A display apparatus having the structure according to embodiments of the present disclosure may be manufactured via the process shown in FIGS. 2A to 2F.

Figure 2A:
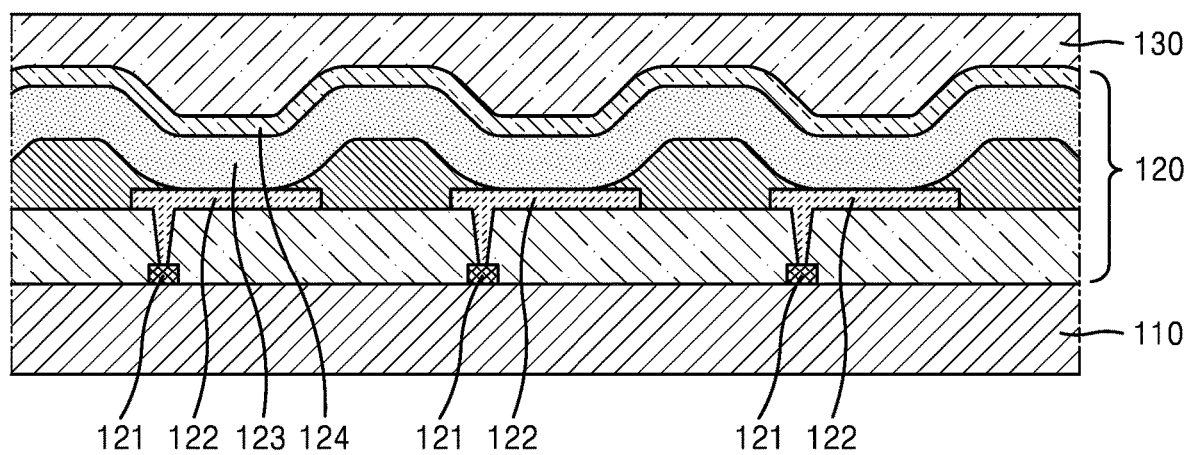
FIGS. 2A to 2F are cross-sectional views that sequentially illustrate a process of manufacturing the display apparatus shown in FIG. 1.

First, as shown in FIG. 2A, the light-emitting device 120 is formed on the first substrate 110 and is covered with a thin film encapsulation layer 130.

Figure 2B:
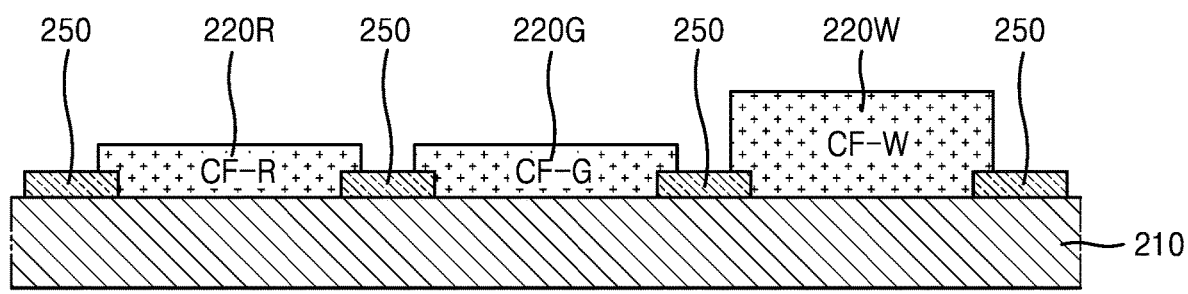

In addition, as shown in FIG. 2B, the black matrix 250 and the color filter layers 220R, 220G, and 220W are each formed on the second substrate 210 via a photolithography process. The color filter layers 220R, 220G, and 220W are each formed at a position corresponding to the light-emitting device 120.

Figure 2C:
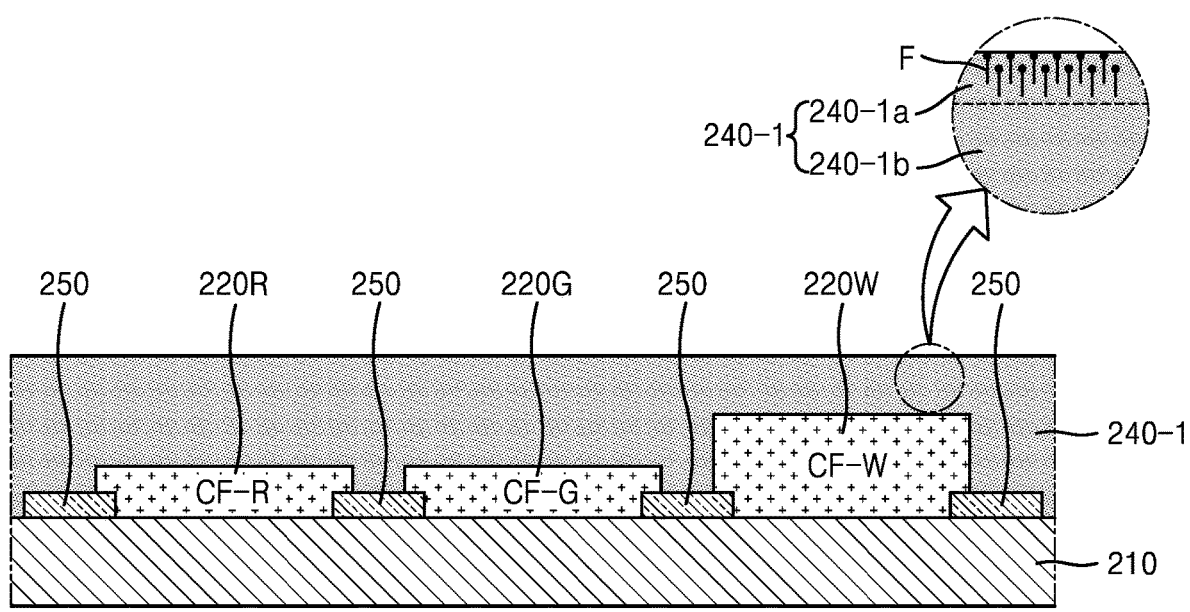

Subsequently, as shown in FIG. 2C, tops of the color filter layers 220R, 220G, and 220W and the black matrix 250 are coated with a composite polymer 240-1 and then heated. The composite polymer 240-1 may have, for example, a fluorine-containing polymer 240-1a (such as polytetrafluoroethylene (PTFE), perfluoropolyether (PFPE), or any combination thereof) and fluorine-free materials 240-1b (including a curable polymer, a photoresist compound, a black pigment, a scattering agent, and a solvent) mixed. For example, the composite polymer 240-1, in which the fluorine-containing polymer 240-1a (containing fluorine (F)) and the fluorine-free materials 240-1b (including a curable polymer, a photoresist compound, a black pigment, a scattering agent, and a solvent) are mixed, is prepared to be coated on the color filter layers 220R, 220G, and 220W and the black matrix 250 and then heated. The fluorine-free materials 240-1b may further include, for example, an acrylic polymer, a silicon compound, a compound including an epoxy group, or any combination thereof.

The composite polymer 240-1 is a material that later becomes a first bank 240, and when the composite polymer 240-1 is heated, the fluorine-containing polymer 240-1a within the composite polymer 240-1 may move toward a one-side surface of the composite polymer 240-1 (e.g., the surface opposite or facing oppositely away from the second substrate 210), and may be lopsidedly arranged. Accordingly, the one-side surface of the composite polymer 240-1 to which the fluorine-containing polymer 240-1a is lopsided is hydrophobic. A curing temperature of the bank may be within a temperature range that does not affect (or does not significantly affect) QD efficiency. For example, the curing temperature of the bank may be about 80° C. to about 250° C.

Figure 2D:
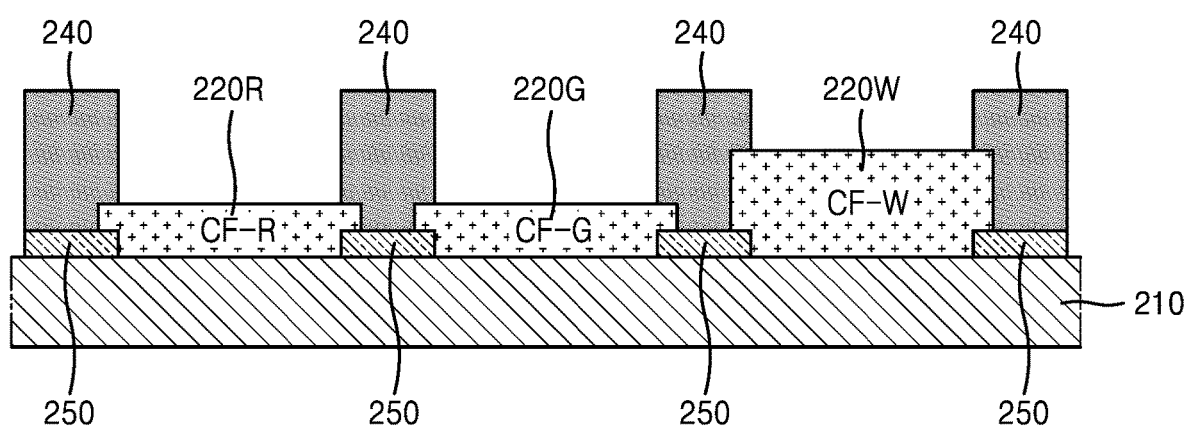

In addition, as shown in FIG. 2D, the composite polymer 240-1 is patterned to form bank 240 and to remain at every position between the color filter layers 220R, 220G, and 220W.

Figure 2E:
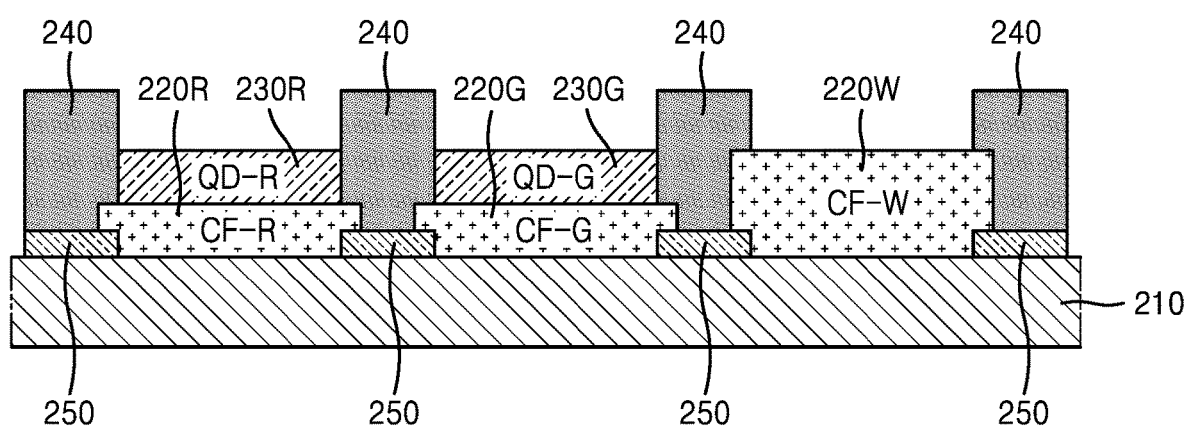

Afterward, as shown in FIG. 2E, the quantum dot layers 230R and 230G are optionally formed only in the red pixel and the green pixel, respectively, and not formed in the blue pixel. In this regard, the quantum dot layers 230R and 230G are formed at positions overlapping the color filter layers 220R and 220G. The quantum dot layers 230R and 230G may be formed via an ink-jet process.

In some embodiments, a photochromic particle, namely, a quantum dot or a core, included the quantum dot layers 230R and 230G may include: a Groups III-VI semiconductor compound; a Groups II-VI semiconductor compound; a Groups III-V semiconductor compound; a Group semiconductor compound; a Groups IV-VI semiconductor compound; a Group IV element or compound; or any combination thereof.

Examples of the Groups III-VI semiconductor compound may include: a binary compound, such as $In_2S_3$, GaS, GaSe, $Ga_2Se_3$, GaTe, InS, InSe, $In_2Se_3$, and/or InTe; a ternary compound, such as AgInS, $AgInS_2$, CuInS, $CuInS_2$, $InGaS_3$, and/or $InGaSe_3$; or any combination thereof.

Examples of the Groups II-VI semiconductor compound may include: a binary compound, such as CdS, CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Groups III-V semiconductor compound may include: a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or GaAlNP; a quaternary compound, such as GaAlNAs, GaAlNSb, GaAl-PAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. In some embodiments, the Groups III-V semiconductor compound may further include a Group II element. Examples of the Groups III-V semiconductor compound further including the Group II element may include InZnP, InGaZnP, and InAlZnP.

Examples of the Group semiconductor compound may include: a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include: a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

The Group IV element or compound may include: a single element compound, such as Si and/or Ge; a binary compound, such as SiC and/or SiGe; or any combination thereof.

Each element included in the multi-element compound such as the binary compound, the ternary compound, and/or the quaternary compound may be present in a particle at a uniform concentration or a non-uniform concentration.

In some embodiments, the quantum dot may have a single structure having a uniform concentration of each element included in the corresponding quantum dot or a dual structure of a core-shell. For example, the material included in the core may be different from the material included in the shell.

The shell of the quantum dot may function as a protective layer for maintaining semiconductor characteristics by preventing or reducing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot are an oxide of metal or non-metal, a semiconductor compound, or any combination thereof. Examples of the oxide of metal or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound may include, as described herein, a Groups III-VI semiconductor compound, a Groups II-VI semiconductor compound, a Groups III-V semiconductor compound, a Groups III-VI semiconductor compound, a Groups I-III-VI semiconductor compound, a Groups IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width of half maximum (FWHM) at an emission wavelength spectrum of the quantum dot may be about 45 nm or less, for example, about 40 nm or less, for example, about 30 nm or less. When the FWHM of the emission wavelength spectrum of the quantum dot is within any of these ranges, color purity and/or color reproduction may be improved. In addition, light emitted through such quantum dot is irradiated in omnidirection. Accordingly, a wide viewing angle may be realized and/or increased.

In some embodiments, the quantum dot may be, for example, a spherical, pyramidal, multi-arm, and/or cubic nanoparticle, a nanotube, a nanowire, a nanofiber, and/or a nanoplate particle.

By adjusting a size of the quantum dot, an energy band gap may be adjusted, thereby obtaining light of various wavelengths in a quantum dot emission layer. Therefore, by using quantum dots of different sizes, a light-emitting device that emits light of various wavelengths may be implemented. For example, the size of the quantum dot may be selected to emit red, green and/or blue light. In addition, the size of the quantum dot may be adjusted such that light of various colors are combined to emit white light.

Figure 2F:
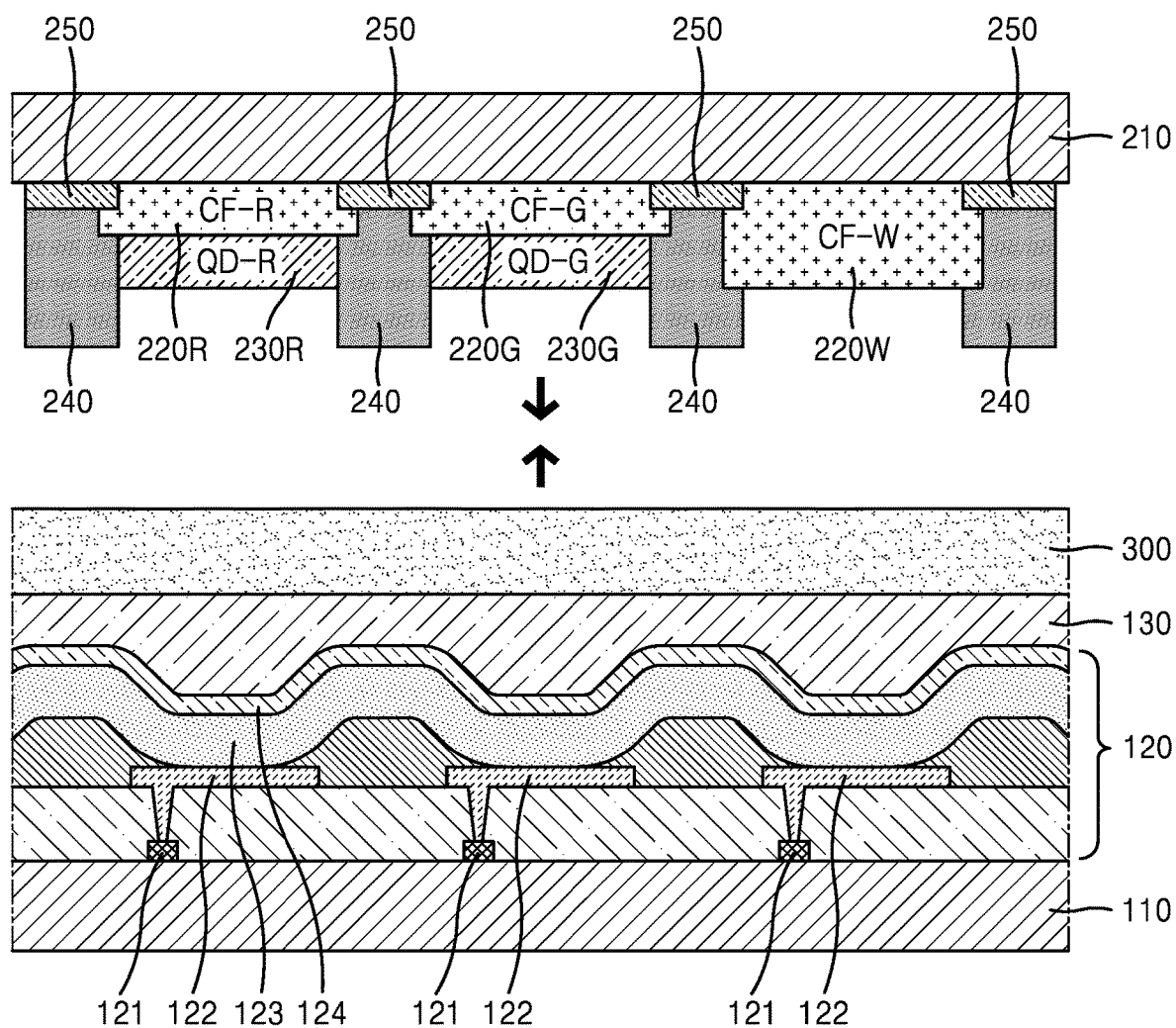

As shown in FIG. 2F after the quantum dot layers 230R and 230G are formed, the filling material 300 is applied between the first substrate 110 and the second substrate 210, and the first substrate 110 and the second substrate 210 are bonded together. Then, as shown in FIG. 1, a display apparatus including the light-emitting device 120, the quantum dot layers 230R and 230G, and the color filter layers 220R, 220G, and 220W is embodied.

Figure 4:
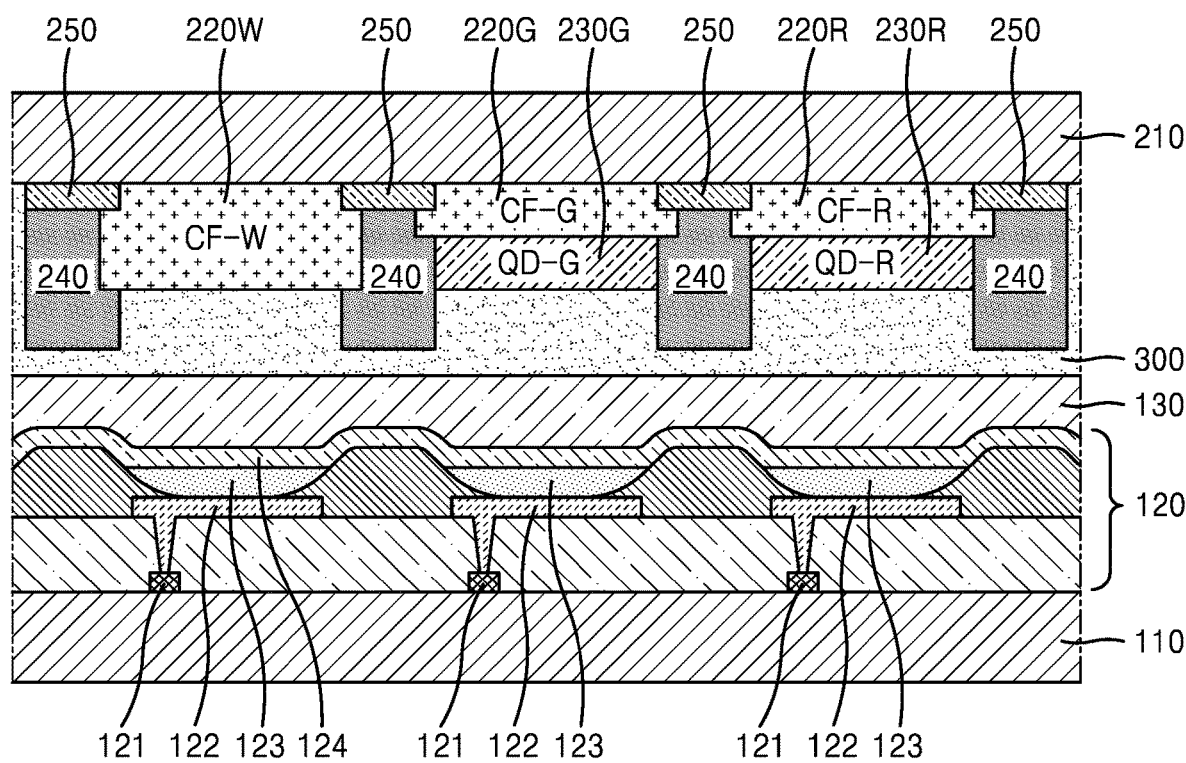
FIG. 4 is a cross-sectional view of a display apparatus according to another embodiment.

In some embodiments, the interlayer 123 including an emission layer of the light-emitting device 120 is formed as a common layer throughout a pixel area. In some embodiments, as shown in FIG. 4, the interlayer 123 may be separately formed for each pixel. For example, the interlayer 123 including the emission layer may be formed as a common layer, or may be formed in a separate state (e.g., as a separate layer) for each pixel.

The emission layer may include an organic light-emitting material or an inorganic light-emitting material.

The light-emitting device 120 will be described in more detail hereinbelow.

First Electrode 122

In FIG. 1, a substrate may be additionally located under the first electrode 122 or above the second electrode 124. The substrate may be a glass substrate and/or a plastic substrate.

The first electrode 122 may be formed by, for example, depositing or sputtering a material for forming the first electrode 122 on the substrate. When the first electrode 122 is an anode, a high work function material that can easily (or suitably) inject holes may be used as a material for forming the first electrode 122.

The first electrode 122 may be a reflective electrode, a semi-transmissive electrode, or a transmissive electrode. When the first electrode 122 is a transmissive electrode, a material for forming the first electrode 122 may include indium tin oxide (ITO), indium zinc oxide (IZO), tin oxide ($SnO_2$), zinc oxide (ZnO), or any combination thereof. In one or more embodiments, when the first electrode 122 is a semi-transmissive electrode or a reflective electrode, a material for forming the first electrode 122 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 122 may have a single-layered structure including (e.g., consisting of) a single layer or a multi-layered structure including a plurality of layers. In an embodiment, the first electrode 122 may have a three-layered structure of ITO/Ag/ITO.

Interlayer 123

The interlayer 123 is located on the first electrode 122. The interlayer 123 includes an emission layer.

The interlayer 123 may further include a hole transport region between the first electrode 122 and the emission layer, and an electron transport region between the emission layer and the second electrode 124.

The interlayer 123 may further include metal-containing compounds such as organometallic compounds and/or inorganic materials (such as quantum dots, and/or the like), in addition to one or more organic materials.

In one or more embodiments, the interlayer 123 may include i) two or more emitting units sequentially stacked between the first electrode 122 and the second electrode 124 and ii) a charge generation layer located between the two emitting units. When the interlayer 123 includes the emitting unit and the charge generation layer as described above, the light-emitting device 120 may be a tandem light-emitting device.

Hole Transport Region in Interlayer 123

The hole transport region may have i) a single-layered structure including (e.g., consisting of) a single material, ii) a single-layered structure including a plurality of different materials, or iii) a multi-layered structure including a plurality of layers including different materials.

The hole transport region may include a hole injection layer (HIL), a hole transport layer (HTL), an emission auxiliary layer, an electron blocking layer (EBL), or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 122.

The hole transport region may include a compound represented by Formula 201, a compound represented by Formula 202, or any combination thereof:

$$R_{201}-(L_{201})_{xa1}-N\begin{matrix}(L_{202})_{xa2}-R_{202}\\ \\ (L_{203})_{xa3}-R_{203}\end{matrix}$$

Formula 201

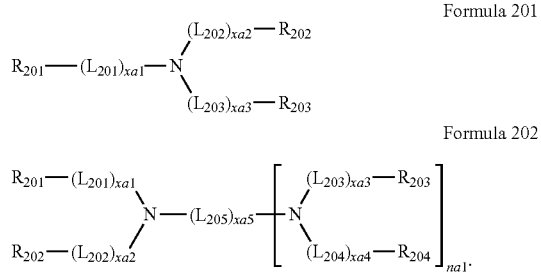

Formula 202

In Formulae 201 and 202, $L_{201}$ to $L_{204}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, and $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group and/or the like) (for example, refer to the following compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

CY201

CY202

CY203

CY204

CY205

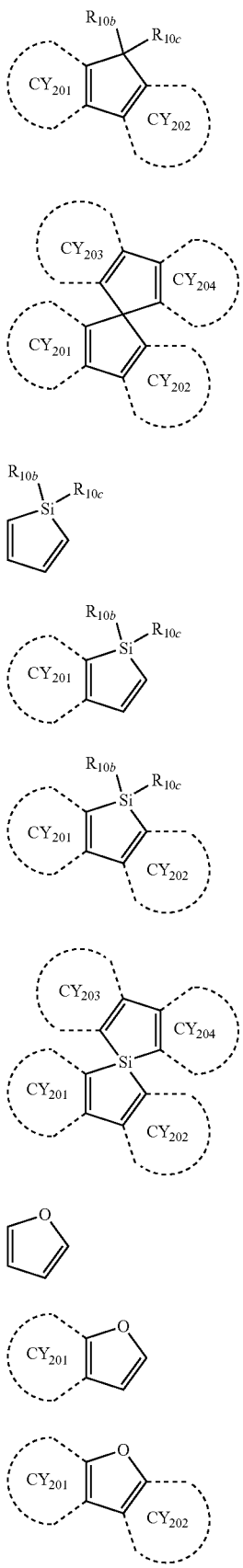

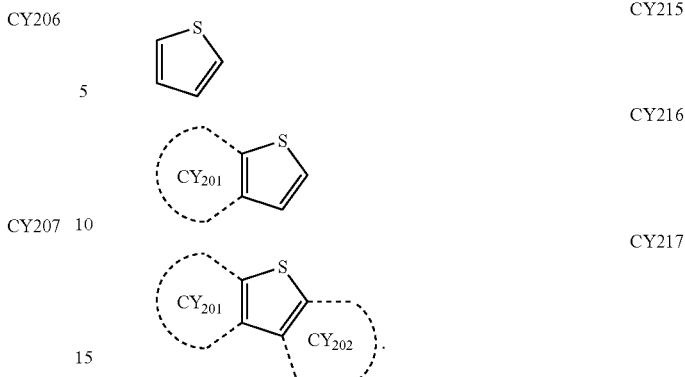

Regarding Formulae CY201 to CY217, $R_{10b}$ and $R_{10c}$ are the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be substituted with $R_{10a}$ described herein.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, satisfactory (or suitable) hole transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block or reduce the flow of electrons from an electron transport region. The emission auxiliary layer and the electron blocking layer may each independently include any of the suitable materials as described above.

p-Dopant

The hole transport region may further include, in addition to the materials described above, a charge-generating material for the improvement of conductive properties. The charge-generating material may be uniformly or non-uniformly dispersed in the hole transport region (for example, in the form of a single layer including (e.g., consisting of) a charge-generating material).

The charge-generating material may be, for example, a p-dopant.

In an embodiment, a lowest unoccupied molecular orbital (LUMO) energy level of the p-dopant may be −3.5 eV or less.

In an embodiment, the p-dopant may include a quinone derivative, a cyano group-containing compound, element EL1 and element EL2-containing compound, or any combination thereof.

Examples of the quinone derivative may include TCNQ and F4-TCNQ.

Examples of the cyano group-containing compound may include HAT-CN and a compound represented by Formula 221 below.

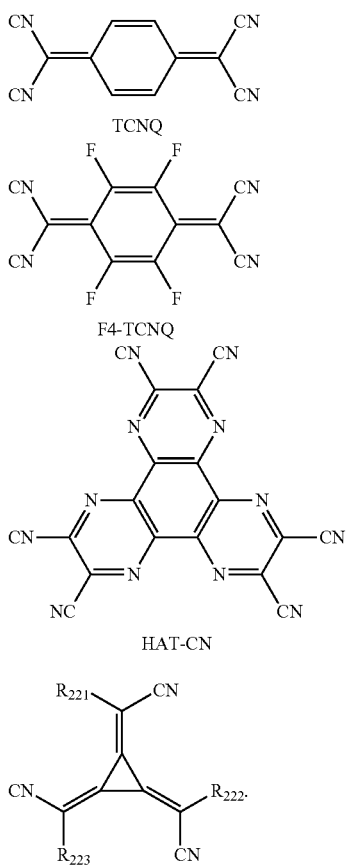

In Formula 221, $R_{221}$ to $R_{223}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the element EL1 and element EL2-containing compound, the element EL1 may be metal, metalloid, or a combination thereof, and element EL2 may be a non-metal, metalloid, or a combination thereof.

Emission Layer in Interlayer 123

When the light-emitting device 120 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other to emit white light. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be from about 0.01 parts by weight to about 15 parts by weight based on 100 parts by weight of the host.

In one or more embodiments, the emission layer may include a quantum dot. A quantum dot is the same as described above.

In some embodiments, the emission layer may include a delayed fluorescent material. The delayed fluorescent material may act as a host or a dopant in the emission layer.

A thickness of the emission layer may be in a range of about 100 Å to about 1,000 Å, for example, about 200 Å to about 600 Å. When the thickness of the emission layer is within any of these ranges, excellent (or improved) light-emission characteristics may be obtained without a substantial increase in driving voltage.

Host

The host may include a compound represented by Formula 301 below:

$$[Ar_{301}]_{xb11}\text{-}[(L_{301})_{xb1}\text{-}R_{301}]_{xb21}. \quad \text{Formula 301}$$

In Formula 301, $Ar_{301}$ and $L_{301}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are the same as described in connection with $Q_1$.

In one or more embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

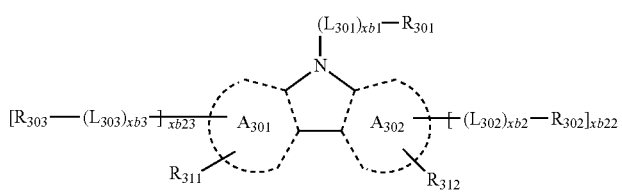

-continued

Formula 301-2

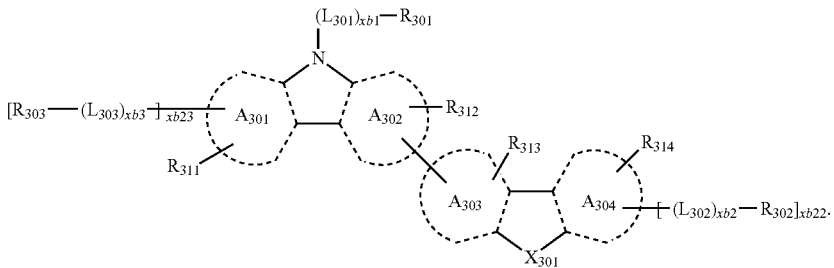

In Formulae 301-1 and 301-2, ring $A_{301}$ to ring $A_{304}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, $xb1_7$ and $R_{301}$ are the same as described above, $L_{302}$ to $L_{304}$ are each independently the same as described in connection with $L_{301}$, xb2 to xb4 may each independently be the same as described in connection with xb1, and $R_{302}$ to $R_{305}$ and $R_{311}$ to $R_{314}$ are the same as described in connection with $R_{301}$.

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more embodiments, the phosphorescent dopant may include an organometallic compound represented by Formula 401:

Formula 401

$M(L_{401})_{xc1}(L_{402})_{xc2}$

Formula 402

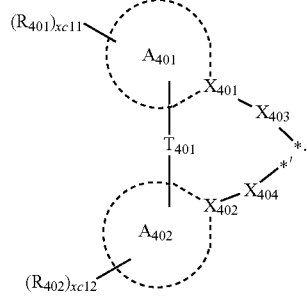

In Formulae 401 and 402,

M may be transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), and/or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C($Q_{411}$)=, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more $L_{401}$(s) may optionally be linked to each other via $T_{402}$, which is a linking group, and/or two ring $A_{402}$(s) in two or more $L_{401}$(s) may optionally be linked to each other via $T_{403}$, which is a linking group (see e.g., Compounds PD1 to PD4 and PD7). $T_{402}$ and $T_{403}$ are the same as described in connection with $T_{401}$.

$L_{402}$ in Formula 401 may be an organic ligand. In one or more embodiments, $L_{402}$ may be a halogen group, a diketone group (for example, an acetylacetonate group), a carboxylic acid group (for example, a picolinate group), —C(=O), an isonitrile group, a —CN group, a phosphorus group (for example, a phosphine group and/or a phosphite group), or any combination thereof.

Fluorescent Dopant

The fluorescent dopant may include an amine group-containing compound, a styryl group-containing compound, or any combination thereof.

In one or more embodiments, the fluorescent dopant may include a compound represented by Formula 501:

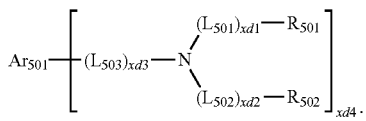

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xd1 to xd3 may each independently be 0, 1, 2, or 3, xd4 may be 1, 2, 3, 4, 5, or 6.

In one or more embodiments, $Ar_{501}$ in Formula 501 may be a condensed cyclic group (for example, an anthracene group, a chrysene group, and/or a pyrene group), in which three or more monocyclic groups are condensed with each other.

In one or more embodiments, xd4 in Formula 501 may be 2.

Delayed Fluorescent Material

The emission layer may include a delayed fluorescent material.

The delayed fluorescent material used herein may be selected from any compound that is capable of emitting delayed fluorescent light based on a delayed fluorescence emission mechanism.

The delayed fluorescent material included in the emission layer may act as a host or a dopant, depending on types (or kinds) of other materials included in the emission layer.

In an embodiment, a difference between a triplet energy level (eV) of the delayed fluorescent material and a singlet energy level (eV) of the delayed fluorescent material may be about 0 eV or more and about 0.5 eV or less. When the difference between the triplet energy level (eV) of the delayed fluorescent material and the singlet energy level (eV) of the delayed fluorescent material satisfies the above-described range, up-conversion from a triplet state to a singlet state of the delayed fluorescent material may effectively (or suitably) occur, and thus, luminescence efficiency of the light-emitting device 120 may be improved.

In one or more embodiments, the delayed fluorescent material may include: i) a material that includes at least one electron donor (for example, a π electron-rich $C_3$-$C_{60}$ cyclic group, such as a carbazole group) and at least one electron acceptor (for example, a sulfoxide group, a cyano group, and/or a π-electron-deficient nitrogen-containing $C_1$-$C_{60}$ cyclic group), or ii) a material including a $C_8$-$C_{60}$ polycyclic group in which two or more cyclic groups share boron (B) and are condensed with each other.

Electron Transport Region in the Interlayer 123

The electron transport region may have: i) a single-layered structure including (e.g., consisting of) a single material, ii) a single-layered structure including a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In one or more embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, and/or the electron transport layer in the electron transport region) may include a metal-free compound including at least one π-electron-deficient nitrogen-containing $C_1$-$C_{60}$ cyclic group.

In one or more embodiments, the electron transport region may include a compound represented by Formula 601 below:

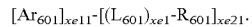

In Formula 601, $Ar_{601}$ and $L_{601}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are the same as described in connection with $Q_1$, xe21 may be 1, 2, 3, 4, or 5, and at least one of Arm, $L_{601}$, and $R_{601}$ may each independently be a π-electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

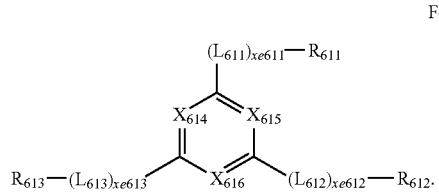

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may be understood by referring to the description presented in connection with $L_{601}$, xe611 to xe613 may be understood by referring to the description presented in connection with xe1, $R_{611}$ to $R_{613}$ may be understood by referring to the description presented in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, xe1 and xe611 to xe613 in Formula 601 and 601-1 may each independently be 0, 1, or 2.

A thickness of the electron transport region may be from about 160 Å to about 5,000 Å, for example, about 100 Å to about 4,000 Å. When the electron transport region includes a buffer layer, a hole blocking layer, an electron control layer, an electron transport layer, or any combination thereof, a thickness of the buffer layer, the hole blocking layer, and/or the electron control layer may each independently be from about 20 Å to about 1,000 Å, for example, about 30 Å to about 300 Å, and a thickness of the electron transport layer may be from about 100 Å to about 1,000 Å, for example, about 150 Å to about 500 Å. When the thicknesses of the buffer layer, the hole blocking layer, the electron control layer, the electron transport layer, and/or the electron transport layer are within any of their respective ranges, satisfactory (or suitable) hole transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may each independently be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

In one or more embodiments, the metal-containing material may include a Li complex. The Li complex may include, for example, Compound ET-D1 (LiQ) and/or Compound ET-D2:

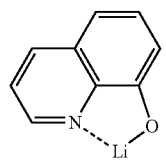

ET-D1

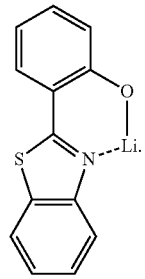

ET-D2

The electron transport region may include an electron injection layer that facilitates injection of electrons from the second electrode 124. The electron injection layer may directly contact the second electrode 124.

The electron injection layer may have: i) a single-layered structure including (e.g., consisting of) a single material, ii) a single-layered structure including a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may each independently be selected from oxides and halides (for example, fluorides, chlorides, bromides, and/or iodides) of the alkali metal, the alkaline earth metal, and the rare earth metal, respectively, telluride, and any combinations thereof.

The alkali metal-containing compound may be selected from alkali metal oxides (such as $Li_2O$, $Cs_2O$, and/or $K_2O$), and alkali metal halides (such as LiF, NaF, CsF, KF, LiI, NaI, CsI, and/or KI), and any combinations thereof. The alkaline earth metal-containing compound may include an alkaline earth metal compound, such as BaO, SrO, CaO, $Ba_xSr_{1-x}O$ (where x is a real number that satisfies the condition of $0<x<1$), and/or $Ba_xCa_{1-x}O$ (where x is a real number that satisfies the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of metal ions of the alkali metal, the alkaline earth metal, and the rare earth metal, respectively, and ii) as a ligand linked to the metal ion, for example, a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

The electron injection layer may include (e.g., may consist of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may include (e.g., may consist of) i) an alkali metal-containing compound (for example, an alkali metal halide), or ii) a) an alkali metal-containing compound (for example, an alkali metal halide); and b) alkali metal, alkaline earth metal, rare earth metal, or any combination thereof. In one or more embodiments, the electron injection layer may be a KI:Yb co-deposited layer or a RbI:Yb co-deposited layer.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within any of the ranges described above, the electron injection layer may have satisfactory (or suitable) electron injection characteristics without a substantial increase in driving voltage.

Second Electrode 124

The second electrode 124 is arranged on the interlayer 123. The second electrode 124 may be a cathode, which is an electron injection electrode, and as a material for forming the second electrode 124, a metal, an alloy, an electrically conductive compound, or any combination thereof, each having a low work function, may be used.

The second electrode 124 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 124 may be a transmissive electrode, a semi-transmissive electrode, or a reflective electrode.

The second electrode 124 may have a single-layered structure or a multi-layered structure including two or more layers.

Capping Layer

A first capping layer may be located outside the first electrode 122, and/or a second capping layer may be located outside the second electrode 124. In some embodiments, the light-emitting device 120 may have a structure in which the first capping layer, the first electrode 122, the interlayer 123, and the second electrode 124 are sequentially stacked in this stated order, a structure in which the first electrode 122, the interlayer 123, the second electrode 124, and the second capping layer are sequentially stacked in this stated order, or a structure in which the first capping layer, the first electrode 122, the interlayer 123, the second electrode 124, and the second capping layer are sequentially stacked in this stated order.

Light generated in the emission layer in the interlayer 123 of the light-emitting device 120 may be extracted toward the outside through the first electrode 122, which is a semi-transmissive electrode or a transmissive electrode, and the first capping layer, and light generated in the emission layer in the interlayer 123 of the light-emitting device 120 may be extracted toward the outside through the second electrode 124, which is a semi-transmissive electrode or a transmissive electrode, and the second capping layer.

The first capping layer and the second capping layer may increase external luminescence efficiency according to the principle of constructive interference. Accordingly, light extraction efficiency of the light-emitting device 120 may be increased, such that luminescence efficiency of the light-emitting device 120 may be improved.

Each of the first capping layer and the second capping layer may include a material having a refractive index of about 1.6 or more (at 589 nm).

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In one or more embodiments, at least one of the first capping layer and second capping layer may each independently include a compound represented by Formula 201, a compound represented by Formula 202, or any combination thereof.

Preparation Method

Layers constituting the hole transport region, the emission layer, and layers constituting the electron transport region may each independently be formed in a certain region by using one or more suitable methods selected from vacuum deposition, spin coating, casting, Langmuir-Blodgett (LB) deposition, ink-jet printing, laser-printing, and laser-induced thermal imaging.

When any of the layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

When any of the layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

DEFINITION OF TERMS

The term "$C_3$-$C_{60}$ carbocyclic group" as used herein refers to a cyclic group that consists of carbon atoms only as ring-forming atoms, and has three to sixty carbon atoms, and the term "$C_1$-$C_{60}$ heterocyclic group" as used herein refers to a cyclic group that has one to sixty carbon atoms as ring-forming atoms, and further includes at least one heteroatom as a ring-forming atom. The $C_3$-$C_{60}$ carbocyclic group and the $C_1$-$C_{60}$ heterocyclic group may each independently be a monocyclic group that consists of one ring, or a polycyclic group in which two or more rings are condensed with each other. In one or more embodiments, the total number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty ring-forming carbon atoms and does not include *—N=*' as a ring-forming moiety, and the term "π-electron-deficient nitrogen-containing $C_1$-$C_{60}$ cyclic group" as used herein refers to a heterocyclic group that has one to sixty ring-forming carbon atoms and includes *—N=*' as a ring-forming moiety.

For example, the $C_3$-$C_{60}$ carbocyclic group may be i) a group T1 or ii) a condensed cyclic group in which two or more groups T1 are condensed with each other. Non-limiting examples of the $C_3$-$C_{60}$ carbocyclic group include a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and an indenoanthracene group.

For example, the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other. Non-limiting examples of the $C_1$-$C_{60}$ heterocyclic group include a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and an azadibenzofuran group.

For example, the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other. Non-limiting examples of the π electron-rich $C_3$-$C_{60}$ cyclic group include a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

For example, the π-electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other. Non-limiting examples of the π-electron-deficient nitrogen-containing $C_1$-$C_{60}$ cyclic group include a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and an azadibenzofuran group.

For example, the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or a bicyclo[2.2.1]heptane group), a norbornene group, a bicyclo[1.1.1]pentane group, a bicyclo[2.1.1] hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π-electron-deficient nitrogen-containing $C_1$-$C_{60}$ cyclic group" as used herein refer to a group that is condensed with a cyclic group, a monovalent group, or a polyvalent group (for example, a divalent group, a trivalent group, a tetravalent group, and/or the like), according to a structure of a formula described with corresponding terms. In one or more embodiments, "a benzene group" may be a benzo group, a phenyl group, a phenylene group, and/or the like, which should be apparent to one of ordinary skill in the art based on a structure of a formula including the "benzene group."

In one or more embodiments, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at either terminus of a $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at either terminus of a $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and non-limiting examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to 1 to 10 ring-forming carbon atoms, at least one heteroatom as a ring-forming atom, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to 1 to 10 ring-forming carbon atoms, at least one heteroatom as a ring-forming atom, and at least one carbon-carbon double bond in the cyclic structure thereof. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective two or more rings may be fused to each other.

The term "$C_1$-$C_{60}$ heteroaryl group" as used herein refers to a monovalent group having a heterocyclic aromatic system that has, in addition to 1 to 60 ring-forming carbon atoms, at least one heteroatom as a ring-forming atom. The term "$C_1$-$C_{60}$ heteroarylene group" as used herein refers to a divalent group having the same structure as the $C_1$-$C_{60}$ heteroaryl group. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective two or more rings may be condensed with each other.

The term "monovalent non-aromatic condensed polycyclic group" as used herein refers to a monovalent group having two or more rings condensed with each other, only carbon atoms as ring-forming atoms (for example, 8 to 60 carbon atoms), and non-aromaticity in its entire molecular structure (e.g., the molecular structure as a whole is non-aromatic). Non-limiting examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, 1 to 60 carbon atoms), as a ring-forming atom, and non-aromaticity in its entire molecular structure (e.g., the molecular structure as a whole is non-aromatic). Non-limiting examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$R_{10a}$" as used herein refers to:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom" as used herein refers to any atom other than a carbon atom. Examples of the heteroatom are O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, manufacture of a display apparatus according to an embodiment and results of evaluation thereof will be described with examples.

Preparation of Bank Composition

Composition 1

1 g of photoinitiator, 93.5 g of alkali-soluble resin (epoxy acrylate), 5 g of polytetrafluoroethylene (PTFE), and 0.5 g of carbon black were mixed with 200 ml of propylene glycol methyl ether acetate (PGMEA) solvent, to thereby prepare a Bank Composition 1.

Composition 2

1 g of photoinitiator, 83.5 g of alkali-soluble resin (epoxy acrylate), 5 g of polytetrafluoroethylene (PTFE), 0.5 g of carbon black, and 10 g of $TiO_2$ were mixed with 200 ml of propylene glycol methyl ether acetate (PGMEA) solvent, to thereby prepare a Bank Composition 2.

Comparative Example 1

First, as shown in FIG. 2A, the light-emitting device 120 was formed on the first substrate 110 and was covered with the thin film encapsulation layer 130. As an emission layer included in an interlayer of the light-emitting device 120, a blue emission layer was formed as a common layer.

Next, on the second substrate 210, as shown in FIG. 2B, the black matrix 250 and the color filter layers 220R, 220G, and 220W were each formed at a position corresponding to the light-emitting device 120 via a photolithography process.

Next, as shown in FIG. 2C, tops of the color filter layers 220R, 220G, and 220W and the black matrix 250 were coated with the Bank Composition 1 (element 240-1 in FIG. 2C), heated at 180° C. for 10 minutes and cured, and then, as shown in FIG. 2D, every position between the color filter layers 220R, 220G, and 220W was patterned to remain as banks 240 (a width of each bank: 10 μm).

Afterwards, as shown in FIG. 2E, the quantum dot layers 230R and 230G were optionally formed only in the red pixel and the green pixel except for the blue pixel via an ink-jet process.

Next, as shown in FIG. 2F, the filling material 300 was applied between the first substrate 110 and the second substrate 210 to bond the first substrate 100 and the second substrate 210, thereby completing a display apparatus including the light-emitting device 120, the quantum dot layers 230R and 230G, and the color filter layers 220R, 220G, and 220W.

Example 1

A display apparatus was manufactured in the same manner as in Comparative Example 1, except that the Bank Composition 2 was used instead of the Bank Composition 1 when forming a bank.

Light efficiency of the display apparatuses of Comparative Example 1 and Example 1 was measured, and results are shown in Table 1.

TABLE 1

| | Comparative Example 1 | | Example 1 | |
|---|---|---|---|---|
| Emission color | Green | Red | Green | Red |
| Light efficiency(%) | 44.0 | 17.9 | 50.7(115%) | 20.1(113%) |
| x | 0.325 | 0.662 | 0.326 | 0.663 |
| y | 0.652 | 0.331 | 0.652 | 0.329 |
| Current(A) | 1.5 | 1.4 | 1.5 | 1.4 |

From the results shown in Table 1, it can be seen that light efficiency of red and green in the display apparatus of Example 1 is improved by 13% and 15%, respectively, compared to light efficiency of red and green in the display apparatus of Comparative Example 1.

Because the display apparatus according to an embodiment includes a bank including a black pigment and a scattering agent, color mixing between pixels is prevented or reduced, and light efficiency is increased.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A display apparatus comprising:
a first substrate on which a plurality of light-emitting devices are arranged;
a plurality of light controllers arranged above the first substrate and corresponding to the plurality of light-emitting devices; and
a plurality of banks between the plurality of light controllers,
wherein each bank of the plurality of banks comprises a black pigment and a scattering agent, the black pigment and the scattering agent each being dispersed throughout each bank, and the scattering agent is 10 times or more in amount than the black pigment.

2. The display apparatus of claim 1, further comprising a second substrate facing the first substrate,
wherein the plurality of light controllers and the plurality of banks are between the first substrate and the second substrate.

3. The display apparatus of claim 2, wherein each bank has an upper portion facing in a direction toward the first substrate, or an upper portion facing in a direction toward the second substrate, and
the upper portion facing in the direction toward the first substrate, or the upper portion facing in the direction toward the second substrate, is hydrophobic.

4. The display apparatus of claim 2, wherein, each bank has an upper portion facing in a direction toward the first substrate, or an upper portion facing in a direction toward the second substrate, and
in the upper portion facing in the direction toward the first substrate, or in the upper portion facing in the direction toward the second substrate, a cross-linked fluorine-containing polymer is lopsidedly arranged.

5. The display apparatus of claim 4, wherein the fluorine-containing polymer comprises polytetrafluoroethylene (PTFE), perfluoropolyether (PFPE), or any combination thereof.

6. The display apparatus of claim 2, wherein each bank has an upper portion facing in a direction toward the first substrate, or an upper portion facing in a direction toward the second substrate, and
a surface energy of the upper portion facing in the direction toward the first substrate, or a surface energy of the upper portion facing in the direction toward the second substrate, is 25 dyne/cm or less.

7. The display apparatus of claim 1, wherein the black pigment in each bank is 0.25 wt % to 1.0 wt % in amount based on a total weight of the bank.

8. The display apparatus of claim 1, wherein the scattering agent in each bank is 10 wt % or more in amount based on a total weight of the bank.

9. The display apparatus of claim 1, wherein the black pigment comprises carbon black, graphite, an iron oxide, or any combination thereof.

10. The display apparatus of claim 1, wherein the scattering agent comprises a metal oxide, a non-metal oxide, or any combination thereof.

11. The display apparatus of claim 1, wherein the scattering agent comprises $SiO_2$, $BaSO_4$, $Al_2O_3$, ZnO, $ZrO_2$, $TiO_2$, or any combination thereof.

12. The display apparatus of claim 1, wherein all of the plurality of light-emitting devices are to generate blue light.

13. The display apparatus of claim 1, wherein the plurality of light controllers comprise a quantum dot layer, a color filter layer, or any combination thereof.

14. The display apparatus of claim 13, wherein the plurality of light-emitting devices are to generate blue light, and
the quantum dot layer is to convert the blue light into one selected from red light and green light.

15. The display apparatus of claim 13, wherein the color filter layer is to increase color purity of light being emitted.

16. The display apparatus of claim 13, wherein the quantum dot layer comprises a Groups III-VI semiconductor compound, a Groups II-VI semiconductor compound, a Groups III-V semiconductor compound, a Groups semiconductor compound, Groups IV-VI semiconductor compound, a Group IV element, a Group IV compound, or any combination thereof.

17. The display apparatus of claim 16, wherein the Groups III-VI semiconductor compound comprises: $In_2S_3$, GaS, GaSe, $Ga_2Se_3$, GaTe, InS, InSe, $In_2Se_3$, InTe, AgInS, $AgInS_2$, CuInS, $CuInS_2$, $InGaS_3$, $InGaSe_3$, or any combination thereof,
the Groups II-VI semiconductor compound comprises: CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, or any combination thereof,
the Groups III-V semiconductor compound comprises: GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, InGaZnP, InAlZnP, or any combination thereof,
the Groups I-III-VI semiconductor compound comprises: AgInS, $AgInS_2$, CuInS, $CuInS_2$, $CuGaO_2$, $AgGaO_2$, $AgAlO_2$, or any combination thereof,
the Groups IV-VI semiconductor compound comprises: SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or any combination thereof, and
the Group IV element or compound comprises: Si, Ge, SiC, SiGe, or any combination thereof.

18. The display apparatus of claim 1, wherein the plurality of light controllers and/or the plurality of banks are ink-jet printed structures.

* * * * *